United States Patent
Nagy et al.

[11] Patent Number: 5,139,973
[45] Date of Patent: Aug. 18, 1992

[54] METHOD FOR MAKING A SEMICONDUCTOR PACKAGE WITH THE DISTANCE BETWEEN A LEAD FRAME DIE PAD AND HEAT SPREADER DETERMINED BY THE THICKNESS OF AN INTERMEDIARY INSULATING SHEET

[75] Inventors: Bela G. Nagy, Acton; Leonard G. Feinstein, Westborough; Yehya M. Kasem, Northboro, all of Mass.

[73] Assignee: Allegro Microsystems, Inc., Worcester, Mass.

[21] Appl. No.: 628,513

[22] Filed: Dec. 17, 1990

[51] Int. Cl.$^5$ .................... H01L 21/56; H01L 21/58; H01L 21/60

[52] U.S. Cl. .................................. 437/211; 437/214; 437/220; 437/902

[58] Field of Search ............... 437/206, 207, 211, 212, 437/214, 220, 902; 357/80, 81, 70

[56] References Cited

U.S. PATENT DOCUMENTS

| | | | |
|---|---|---|---|
| 3,930,114 | 12/1975 | Hodge | 437/902 |
| 4,396,936 | 8/1983 | McIver et al. | 357/72 |
| 4,594,770 | 6/1986 | Butt | 437/220 |
| 5,041,902 | 8/1991 | McShane | 357/70 |

FOREIGN PATENT DOCUMENTS

| | | | |
|---|---|---|---|
| 0164794 | 12/1985 | European Pat. Off. | 357/81 |
| 0069765 | 4/1982 | Japan | 357/81 |
| 0034934 | 3/1983 | Japan | 437/211 |
| 0100447 | 6/1983 | Japan | 437/220 |
| 0072755 | 4/1984 | Japan | 357/81 |

OTHER PUBLICATIONS

IBM Technical Disclosure Bulletin; vol. 25, No. 4, Sep. 1982, Edwards.
IBM Technical Disclosure Bulletin; vol. 15, No. 1, Jun. 1972, Honn.

Primary Examiner—Olik Chaudhuri
Assistant Examiner—David E. Graybill

[57] ABSTRACT

A lead frame and die sub-assembly is first manufactured by a conventional method including bonding a die to the die attach pad of a lead frame and connecting wires between the die and the lead frame fingers. The sub-assembly is stacked first adjacent a dielectric plastic sheet that is in turn stacked against a metal heat spreader block. The dielectric sheet has a centrally located hole registered with the die attach pad. A dollop of an uncured resin is dispensed in the gap between the die attach pad and block. This assembly is compressed between two hot platens whereby the lead fingers, dielectric sheet and the block are bonded together and the resin dollop is flattened to a controlled thickness, namely the thickness of the dielectric sheet. The thickness of the dielectric sheet controls the flattened thickness of the cured resin dollop. After the platens are withdrawn, the local portion of the lead frame having been bonded in the stack is then put into a mold and the stack assembly encapsulated in a thermosetting resin to produce the semiconductor package.

12 Claims, 2 Drawing Sheets

METHOD FOR MAKING A SEMICONDUCTOR PACKAGE WITH THE DISTANCE BETWEEN A LEAD FRAME DIE PAD AND HEAT SPREADER DETERMINED BY THE THICKNESS OF AN INTERMEDIARY INSULATING SHEET

BACKGROUND OF THE INVENTION

This invention relates to a method for making a semiconductor package that includes stacking a conventional lead frame and semiconductor die sub-assembly with a patterned sheet of an insulating material and a metal heat spreading block, and bonding the stack of components together.

Methods for the mass production of semiconductor packages with few exceptions include automatically mounting semiconductor die on the die attach pads of lead frames and by automatically connecting the terminals or terminal pads of the die to lead fingers of the lead frame by fine wires.

However, when a heat spreader block is to be included in the package it has heretofore been found necessary to deviate from the standard methods for making the die to lead frame sub-assembly and thus additional tooling has been required to manufacture such prior art packages incorporating a heat spreader.

It is therefore an object of this invention to provide a method in which mass produced die to lead frame sub-assemblies are incorporated in a semiconductor package including a heat spreader thermally intimate with the lead frame.

It is yet another object of this invention to provide such a method amenable to mass production using standard production lead frames, standard lead frame to die sub-assemblies and standard lead frame handling machines, parts-picking and placing machines.

It is a further object of this invention to provide such a method in which the distal ends of the lead frame fingers and the lead frame die attach pad are uniformly and repeatably connected thermally but may be insulated electrically from a heat spreader block.

It is another object of this invention to provide such a method in which a different insulating medium is employed for insulating of the lead frame finger ends than is used for insulating the die attach pad from the heat spreader block to afford versatility in thermal design of the semiconductor package.

SUMMARY OF THE INVENTION

A method for making a semiconductor device package includes forming a stack of three sub-assemblies, namely a standard sub-assembly of a lead frame with a semiconductor die bonded to a die attach pad thereof: a fully cured dielectric polymeric sheet that may carry an adhesive coating on each side thereof, the dielectric sheet having a central opening therein: and a heat spreader comprised of a metal block that may carry a plastic adhesive dollop, e.g. an uncured resin. Alternatively, the wet dollop may be dispensed on the back side of the die attach pad. The dielectric sheet is registered in the stack with the central opening registered with the die attach pad of the lead frame. The heat spreader is registered in the stack with the region thereof, that is anticipated to be wet bonded through the opening of the dielectric sheet to the die attach pad. These three sub-assemblies are then bonded to each other. This bonded together stack may then be encapsulated in a standard molding step and the finished semiconductor package may then be separated from the outer supporting members of the lead frame.

These steps provide a fully automatable method wherein the thickness of the cured resin dollop, that becomes the major thermal path between the heat die attach pad and the heat spreader, is controlled by the thickness of the dielectric sheet to yield excellent uniformity in manufacturing of package thermal performance.

Furthermore, this method makes it possible to employ many if not all of the existing standard lead frames with a die attach pad, and to manufacture by entirely automatic means the intermediary three-component stack produced by this method, using standard pick and place machines, lead frame handling and registering machines and the like with little modification.

And further, the resin dollop may be filled with electrically conductive particles providing electrical connection of the die to the die attach pad and enhancing the thermal connection therebetween.

DESCRIPTION OF THE PREFERRED EMBODIMENTS

Figure 1:
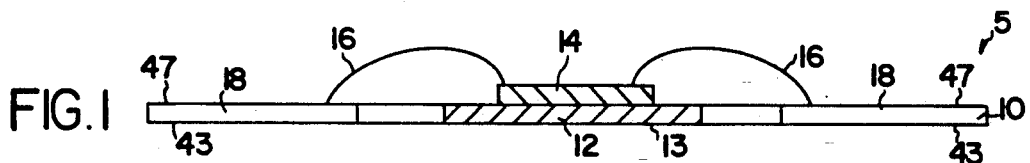
FIG. 1 shows in side sectional view a first assembly 5 including a lead frame having bonded thereto a semiconductor die.

In the preferred method of this invention a first assembly 5 as shown in FIG. 1 includes a patterned metal lead frame 10 with a die attach pad 12, a semiconductor die 14 mounted to the die attach pad 12 and fine wires 16 electrically connecting terminal points of the semiconductor die 14, respectively, to distal end portions of lead frame fingers 18. Methods for forming assembly 5 are well known.

Figure 2:
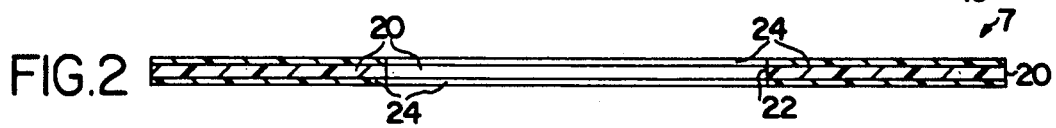
FIG. 2 shows in side sectional view an assembly 7 including an insulative sheet for mating with the first assembly 5 of FIG. 1.

With reference to FIG. 2 an electrically insulative sheet 20 of a fully cured polymeric material, such as "Kapton" (a Trademark of E. I. duPont de Nemours, Wilmington, Delaware) is generally of rectangular shape and has a rectangular opening or hole 22 by having removed or cut away a piece of the sheet 20 from a central region thereof. A thin layer 24 of an adhesive material coats both sides of the sheet 20. The material of layer 24 is a heat curable adhesive, preferably a partially cured or B-stage epoxy.

Figure 3:
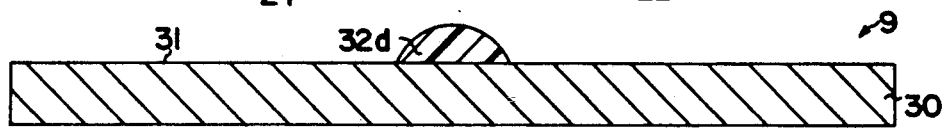
FIG. 3 shows in side sectional view an assembly 9 including a metal heat spreader for mating with the insulative sheet of FIG. 2.

The heat spreader 30 shown in FIG. 3 may be any highly heat conductive metal such as copper or aluminum. The heat spreader 30 is a right parallelepiped, a rectangular block and may be nickel plated.

Figure 4:
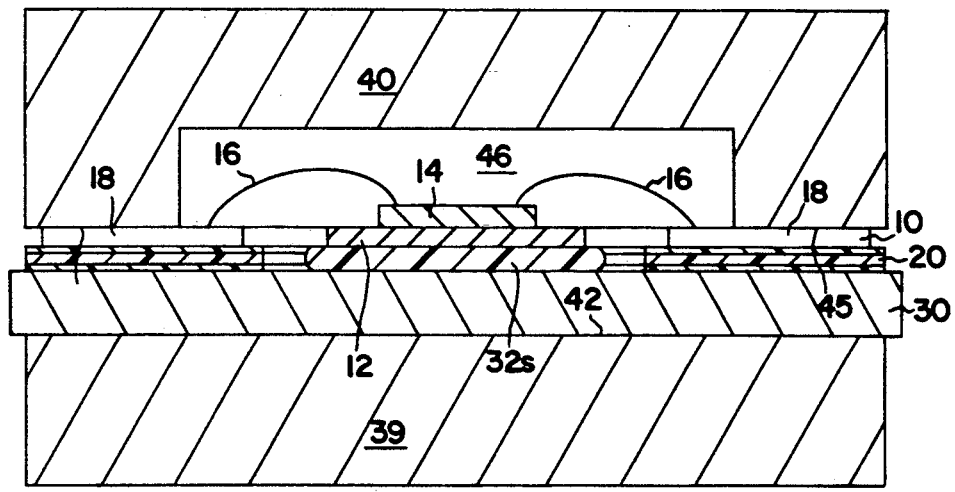
FIG. 4 shows in side sectional view a stack of the three assemblies shown in FIGS. 1, 2 and 3, being compressed between two platens.

Prior to forming a stack of assemblies as is depicted in FIG. 4, and with reference to FIG. 3, a viscous dollop 32d of uncured epoxy resin is dispensed on the top surface 31 of the heat spreader 30, forming the assembly 9. Alternatively the dollop 32d of uncured resin may be dispensed on the bottom surface 13 of the die attach pad 12.

It is necessary in any case to locate the dollop 32d so that when the parts 5, 7 and 9 are assembled as in FIG. 4, it is squeezed within the hole 22 of the insulative sheet 20 between the die attach pad 12 and the heat spreader block 30. In other words, the dollop 32d if dispensed on the top surface 31 of the heat spreader 30, must be located in the area thereof that is anticipated will lie opposite the bottom surface 13 of the die attach pad 12 in the stack shown in FIG. 4.

The stack of assemblies 5, 7 and 9 is then formed and squeezed between two hot platens 39 and 40 as in FIG. 4. The contacting surface 42 of the lower platen 39 is conformal with the bottom side surface portions 13 and 43 of the lead frame 10. In this preferred embodiment both these surfaces, namely the top surface 42 of the bottom platen and the bottom lead frame surface 43 composed of surface portions 12 and 43 are each wholly planar. At the bottom surface portion 45 of the upper platen 40, a cavity 46 is formed so that the die 14 and the connecting wires 16 are untouched by the upper platen 40, and so that only the bottom surface portions 45 of the upper platen 40 contacts the stack and presses only the distal end portions 18 of the lead frame 10. In this embodiment, the contacting bottom surface portion 45 of the upper platen 40 is wholly planar as is the upper surface of the distal end portions of the lead frame fingers 18. Thus, more generally in this invention the contacting bottom portion 45 of the upper platen 40 is conformal with the upper surfaces 47 of the distal finger ends 18.

The three assemblies 5, 7 and 9 must of course be registered in the stack essentially as shown in FIG. 4, so that the dollop 32d is aligned with the die attach pad 14.

The stack is held compressed between the hot platens 39 and 40 until the epoxy coatings 24 are at least partially cured to bond the insulating sheet 30 to both the lead frame fingers 18 and to the heat spreader block 30. At the same time the dollop 32d is deformed to provide a broad contact with both the die attach pad 12 and the heat spreader 30. The deformed dollop 32s, as seen in FIG. 4 is also heated at this time to partially cure the dollop of epoxy and bond it to the die attach pad 12 and the heat spreader 30. The stack assembly is now sufficiently bonded together for handling.

The dollop 32d may alternatively be comprised of any other viscous or deformable dielectric material that will compress and adhere to the die attach pad 12 and the heat spreader 30, including other curable organic resins. The curable resins may advantageously be filled with electrically conductive particles such as silver as illustrated in the cured dollop 32s of FIG. 6.

Figure 6:
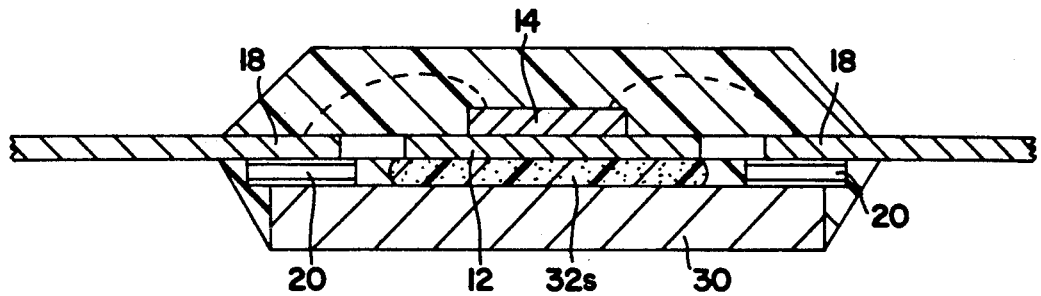
FIG. 6 shows in side sectional view the bonded together stack of FIG. 5, after having been encased in a molded plastic housing, representing a preferred semiconductor package of this invention.
Figure 5:
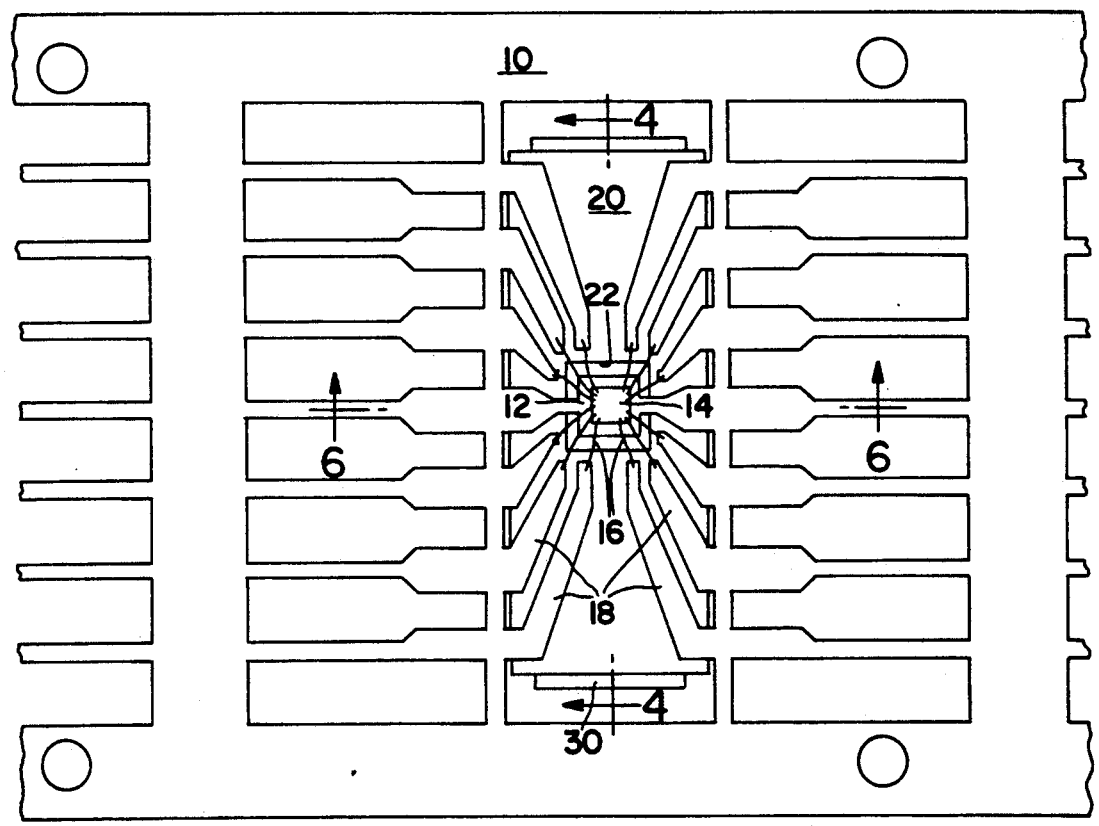
FIG. 5 shows in top view the bonded together stack of FIG. 4, after the platens are removed.

After the compressing step, the platens 39 and 40 are removed. Final cure of the curable resins is subsequently achieved by heating the stack to from 175° C. to 200° C. The lead frame 10 carrying the bonded-together stack of assemblies 5, 7 and 9 is placed in a standard mold (not shown) into which an insulative molding compound is introduced to encapsulate the stack. After this molding step, portions of the lead frame external to the molded package are removed to produce the finished semiconductor package as shown in FIG. 6.

A particularly important feature of the method of this invention is that any of a great variety of lead frames and lead frame assemblies of which FIG. 1 is an example, may be used. This is important because the tooling of custom lead frames is quite expensive. The basic retooling needed to accommodate a lead frame of different geometry is the platens 39 and 40 which as can be seen are simple and relatively non-critical, and the punch for cutting the insulative sheet 20 to the proper dimensions.

Furthermore the thickness of the insulative sheet 20 can be obtained to closely held dimensions and over a wide range of thicknesses. The thickness chosen will depend upon the maximum voltage that it will be required to withstand between any one of the lead fingers 18 and the heat spreader 30. Use of the thinnest possible insulative sheet will provide the maximum thermal conductivity between leads 18 and heat spreader 30. It is only the thickness of the insulative sheet 20 and the thickness of the layers 24 of the heat curable adhesive that determine the thickness of the compressed dollop 32s.

Control of the thickness of the dielectric dollop 32s is an especially important consideration because it is adjacent to the hottest point in the package, namely the die 14, and the thickness of the flattened dollop 32s is inversely related to the thermal conductivity between die attach pad 12 and the heat spreader 30. Thus it is important to recognize that the chosen thickness of the sheet 20 and not the tooling determines the thickness of the crucially important thermal and electrical performance of the dollop 32s.

What is claimed is:

1. A method for making a semiconductor device package comprising in the following order:
    a) bonding a back face of a semiconductor device die to a front oriented side of the die attach pad of a patterned sheet metal lead frame;
    b) connecting, via wires, the terminals on the front face of said die to the front oriented side of distal end portions of the lead fingers of said lead frame, the back sides of said distal finger end portions and the back side of said die attach pad lying in one plane to form a lead frame die sub-assembly:
    c) forming a stack comprising (1) said lead frame die sub-assembly; (2) a uniformly thick electrically insulating sheet of a fully cured polymeric material having a central opening of greater dimensions than those of said die attach pad, said sheet abutting the back oriented side of said lead frame with said central opening registered with said die attach pad: and (3) a heat spreader comprised of a metal block, said distal finger end portions being separated from said heat spreader block in said stack by an intervening portion of said insulating sheet, the space between said die attach pad and said heat spreader block being determined by the thickness of said insulating sheet: and
    d) bonding said dielectric sheet to the front side of said heat spreader and to the back sides of said distal finger end portions.

2. The method of claim 1 wherein said insulating sheet has an adhesive coating on both major surfaces thereof.

3. The method of claim 2 wherein said adhesive coating is heat-curable adhesive coating.

4. The method of claim 3 wherein said adhesive coating is a partially cured polymer.

5. The method of claim 3 wherein said adhesive coating is a B-stage epoxy.

6. The method of claim 2 additionally comprising, simultaneously with said bonding, compressing said stack between two platens that together form a central cavity encompassing without contacting said die and wires.

7. The method of claim 6 wherein said platens are held at an elevated temperature of about 175° C. to at least partially cure said adhesive coating simultaneously with said compressing.

8. The method of claim 6 additionally comprising, prior to said forming a stack, dispensing a dollop of an uncured plastic adhesive material to either the back oriented side of said die attach pad or to the predetermined front surface area of said heat spreader that will lie adjacent said die attach pad in said stack, the thickness of said dispensed dollop being greater than the space between said die attach pad and said heat spreader, so that during said compressing said dollop is flattened to conform with said space and may be cured for attaching said die attach pad to said heat spreader block.

9. The method of claim 8 additionally comprising heating said partially cured dollop to less than 200° C. to fully cure said dollop and to provide a controlled thermal-conductor path between said die attach pad and said heat spreader.

10. The method of claim 1 wherein the temperatures to which said insulating sheet is exposed in said method, during and after said forming a stack, are less than 200° C.

11. The method of claim 8 wherein said plastic adhesive material is an electrically insulating dielectric material.

12. The method of claim 8 wherein said plastic adhesive material is loaded with electrically conductive particles to render said dollop electrically conductive.

* * * * *